United States Patent [19]

Dalencon

[11] 4,360,559
[45] Nov. 23, 1982

[54] PROCESS FOR VARNISHING A CARD EQUIPPED WITH CONNECTING PINS AND CARD OBTAINED IN THIS WAY

[75] Inventor: Claude Dalencon, Paris, France
[73] Assignee: Thomson-CSF, Paris, France
[21] Appl. No.: 288,774
[22] Filed: Jul. 31, 1981
[30] Foreign Application Priority Data
Aug. 13, 1980 [FR] France .................................. 80 17839
[51] Int. Cl.$^3$ ............................. B32B 1/00; B32B 3/00
[52] U.S. Cl. ..................................... 428/174; 428/119; 427/96; 427/154; 427/155; 427/282; 427/300; 427/10
[58] Field of Search .................. 29/842, 843, 844, 845; 427/96, 97, 154, 156, 282, 300, 10; 428/174, 119

[56] References Cited
U.S. PATENT DOCUMENTS
4,315,957  2/1982  Hereth et al. ........................ 427/156

FOREIGN PATENT DOCUMENTS
2121415  8/1972  France .................................. 427/156
7705777  4/1978  Sweden .............................. 427/282

Primary Examiner—Shrive P. Beck

[57] ABSTRACT

The process makes it possible to increase the electrical insulation and corrosion protection permitting the deposition of a varnish over the entire card, including the weld areas of pins. Prior to varnishing the process consists of placing protective sheets perforated at the location of the pins and of protecting the external parts of the pins by means of a deposit of a soap-based solution. The varnish further deposited on the faces of card does not adhere to the parts of the pins protected in this way. After drying the varnish it is merely necessary to clean the pins with hot water and by brushing to remove the protective deposit.

8 Claims, 5 Drawing Figures

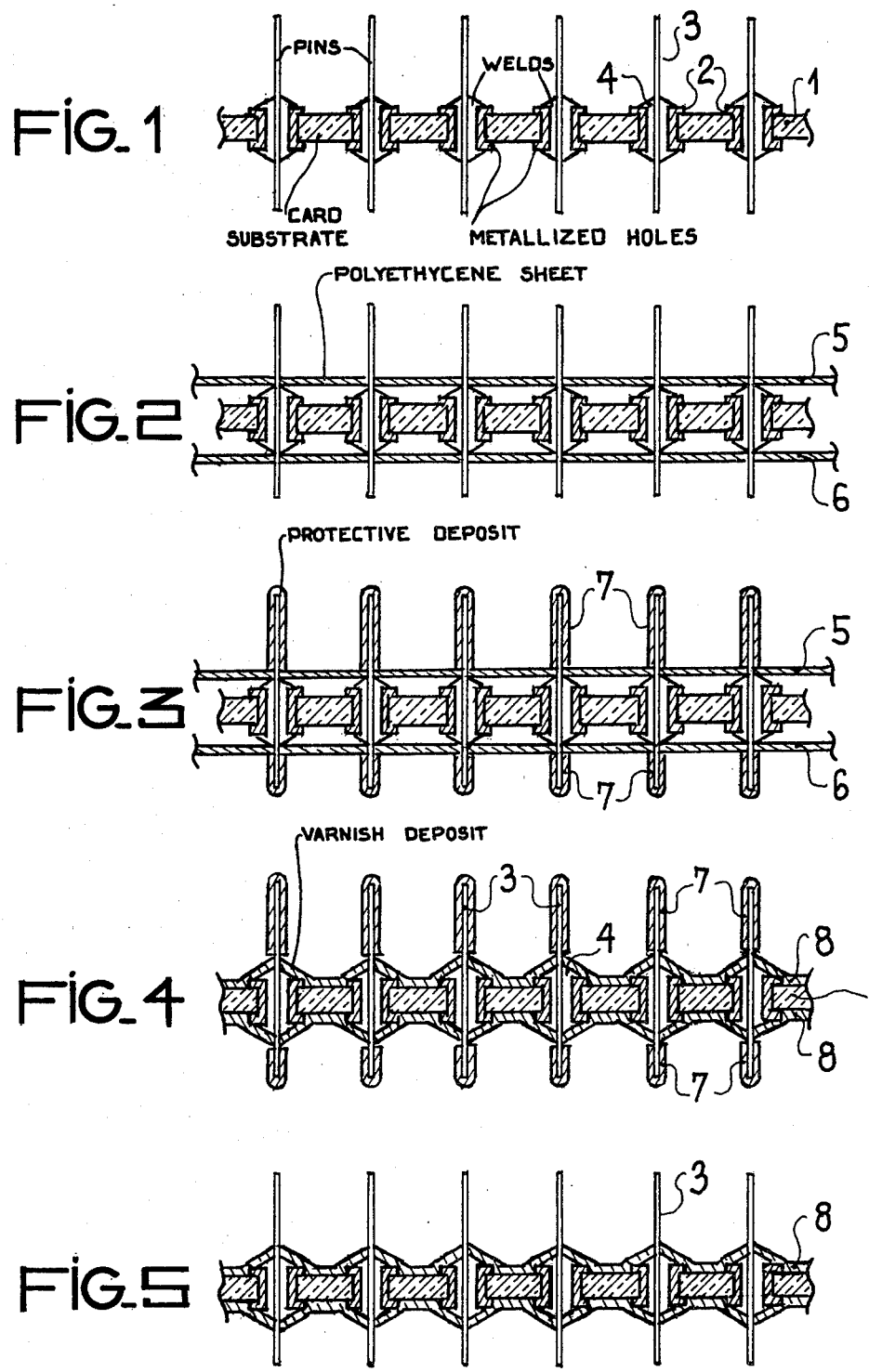

PROCESS FOR VARNISHING A CARD EQUIPPED WITH CONNECTING PINS AND CARD OBTAINED IN THIS WAY

BACKGROUND OF THE INVENTION

The present invention relates to a process for varnishing cards equipped with connecting pins, as well as to the card obtained in this way.

Electronic circuits are generally carried by cards on which are produced printed circuits for interconnecting components or integrated circuits arranged on the card. Interconnection can also take place by means of wrappings. These cards are frequently plugged in parallel to one another to an interconnecting card called a "mother card", whilst the cards carrying the circuits are called "daughter cards". The mother card comprises male connectors constituted by pins welded with a standard pitch to a substrate provided with metallized holes. Part of the pin is used for plugging in the cards and the other shorter part passing from the other side of the substrate can be used for interconnection in the case of cable connections.

With the object of increasing the electrical insulation and protecting the substrate without impairing the contact quality of the pins it is known to varnish or lacquer cards by using, prior to exposure a mask which protects the weld points at the location of the metallized holes. This procedure only permits a partial protection because the location of the welds where the pins are to be positioned is not protected by the varnish. Thus, these parts are not protected against corrosion and are not electrically insulated.

BRIEF SUMMARY OF THE INVENTION

The object of the invention is to obviate these disadvantages by performing a varnishing process which only protects those parts of the pins to be used for interconnection by plugging with a corresponding female connector and the parts intended for possible cabling or wiring, the base of the pins welded to the substrate being protected by the varnish. The process is applicable to any card comprising male pins, a mother card or a daughter card.

The advantages obtained by the invention consist of an industrial application process and a product obtained therefrom which has a high degree of insulation.

According to a feature of the invention the process protects the useful parts of the pins by means of a deposit of a special solution prior to the actual varnish deposit on the two faces of the card.

DESCRIPTION OF THE DRAWINGS AND PREFERRED EMBODIMENTS

The features and advantages of the invention can be gathered from the following description provided in non-limitative manner relative to FIGS. 1 to 5 illustrating the different stages of the process, FIG. 5 corresponding to the finished product.

FIG. 1 shows in section a card provided with male pins. It is possible to see an epoxy glass substrate 1, metallized holes relative to which reference numeral 2 indicates the metal coatings and pins 3 fixed into the holes by means of welds 4. The useful parts of the pins, i.e. those outside the card are used on one side for interconnection by plugging into a corresponding connector and on the other side for effecting cable connections.

FIG. 2 illustrates the first stage of the process consisting of insulating these external parts of the pins from the card by interposing a screen 5 on one side and a screen 6 on the opposite side. These screens must have perforations at the positions of the pins and corresponding to the diameter of the latter in order to subsequently guarantee a good sealing. According to an embodiment screens 5 and 6 are constituted by two sheets of plastics material of limited thickness, e.g. polyethylene with a thickness of a few hundredths of a millimeter. These sheets can be lined by means of an acrylic foam means (or any other more elaborate means), the sheets being perforated by the ends of the pins at the time of lining.

It is then possible to protect the pins in the manner indicated in FIG. 3 by means of a soap-based deposit 7. This deposit is formed by spraying a soapy solution to which a colouring agent has been added. The solution is sprayed on to the pins in the form of a uniform coating so as to protect them. The colouring agent makes it possible to check the uniformity of the protection by a visual control. The solution is formed by a soap mixture, such as a Marseilles soap, with water and an alcohol, such as ethanol in weight proportions which can be as follows: 4 parts of water, 1 part of soap and approximately 2 parts of alcohol. The colouring agent is preferably formed by methylene blue in order to permit a good visual observation of the result and the colouring agent proportion can be very low and in particular below 1%.

After drying the deposit 7 adhering to the pins, screens 5 and 6 are removed and the card varnishing operation is performed. The varnish is represented by deposit 8 in FIG. 4. The protective deposit 7 for the pins has been shown with exaggerated dimensions to facilitate both illustration and understanding. However, it must be remembered that the thickness of deposit 7 is very limited and that no difficulty is encountered in removing screens 5 and 6.

After drying the deposit of varnish 8 it is merely necessary to remove deposit 7 from the pins to obtain the finished product shown in FIG. 5. Deposit 7 can easily be removed by cleaning with hot water to which has been added a wetting agent, followed by the use of a brush. At this stage the colouring agent also permits a visual check of the effectiveness of the cleaning operation. In connection with the card obtained the varnish 8 at the maximum extends over the two faces of the card and in particular covers the weld areas 4 of pins 3 at metallized holes 2, i.e. the bases joining the pins to the card.

The invention is applicable to all electronic cards provided with male pins forming contacts and which require significant insulation, or which must be protected from the hazards created by the environment and in particular corrosion.

What is claimed is:

1. A process for varnishing a card equipped with connecting pins, wherein it comprises the following stages:
   the placing of protective screens on the card substrate so that it is only possible to see those parts of the pins which are external of the card, the screens being perforated at the location of the pins and with the diameter of the latter;
   spraying a soapy solution to which a colouring agent has been added on to the pins in the form of a uniform coating, the colouring agent permitting by a visual control to check the uniformity of the deposit;

removal of the screens after drying the protective deposit of the pins;

varnishing the card;

cleaning with hot water to which a wetting agent has been added and brushing to remove the protective deposit for the pins, after drying the varnish.

2. A process according to claim 1, wherein the soapy solution used comprises a mixture of soap, water, alcohol and a colouring agent.

3. A process according to claim 2, wherein the proportion of the components in the solution is as follows: 4 parts by weight of water, 1 part by weight of soap and approximately 2 parts by weight of alcohol.

4. A process according to claim 2 wherein the colouring agent used is methylene blue.

5. A process according to claim 2, wherein the proportion of the colouring agent in the mixture is below 1% by weight.

6. A process according to claim 1, wherein the screens are formed by two sheets of plastics material perforated by the ends of the pins during the application of the sheets to the substrate.

7. A process according to claim 6, wherein the sheets are made from polyethylene.

8. A card equipped with connecting pins and varnished in accordance with any one of the claims 1, 2 or 4, wherein the deposited varnish extends over the entire card, as well as at the base of the pins, so that it is only possible to see the external parts of the pins.

* * * * *